(12) United States Patent
Falkenberg et al.

(10) Patent No.: US 6,407,928 B1
(45) Date of Patent: Jun. 18, 2002

(54) LED SURFACE MOUNT

(75) Inventors: Dean R. Falkenberg, Windsor; Edward T. Iwamiya, Petaluma, both of CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/607,274

(22) Filed: Jun. 30, 2000

(51) Int. Cl.[7] .................................................. H05K 7/08
(52) U.S. Cl. ...................... 361/760; 361/803; 361/807; 361/808; 361/809; 361/810; 361/811; 361/782
(58) Field of Search ........................... 439/83, 722, 56, 439/736, 660, 74, 876; 362/382, 800, 226, 230, 310, 368; 428/119, 209; 361/760, 782, 803, 807–811

(56) References Cited

U.S. PATENT DOCUMENTS 4,065,198 A * 12/1977 Jordan
4,185,378 A 1/1980 Machida ...................... 29/626
4,534,604 A * 8/1985 Peterson
4,781,960 A * 11/1988 Wittes ........................ 428/119
4,982,376 A 1/1991 Megens et al. ............. 361/400
5,936,264 A 8/1999 Ishinaga ...................... 257/99

* cited by examiner

*Primary Examiner*—Nathan Flynn
*Assistant Examiner*—Kevin Quinto
(74) *Attorney, Agent, or Firm*—Skjerven Morrill LLP; Samuel G. Campbell, III

(57) ABSTRACT

A surface mountable and low profile electrical component which can be electrically coupled to the solder side of a PCB, while other electrical components are mounted to a component side of the PCB. The surface mountable electrical component includes a mounting substrate having a diode or LED chip with electrical terminals. The terminals pass through the mounting substrate to be electrically coupled to first and second electrical contacts, which provide an electrical pathway between the terminals and the PCB.

10 Claims, 4 Drawing Sheets

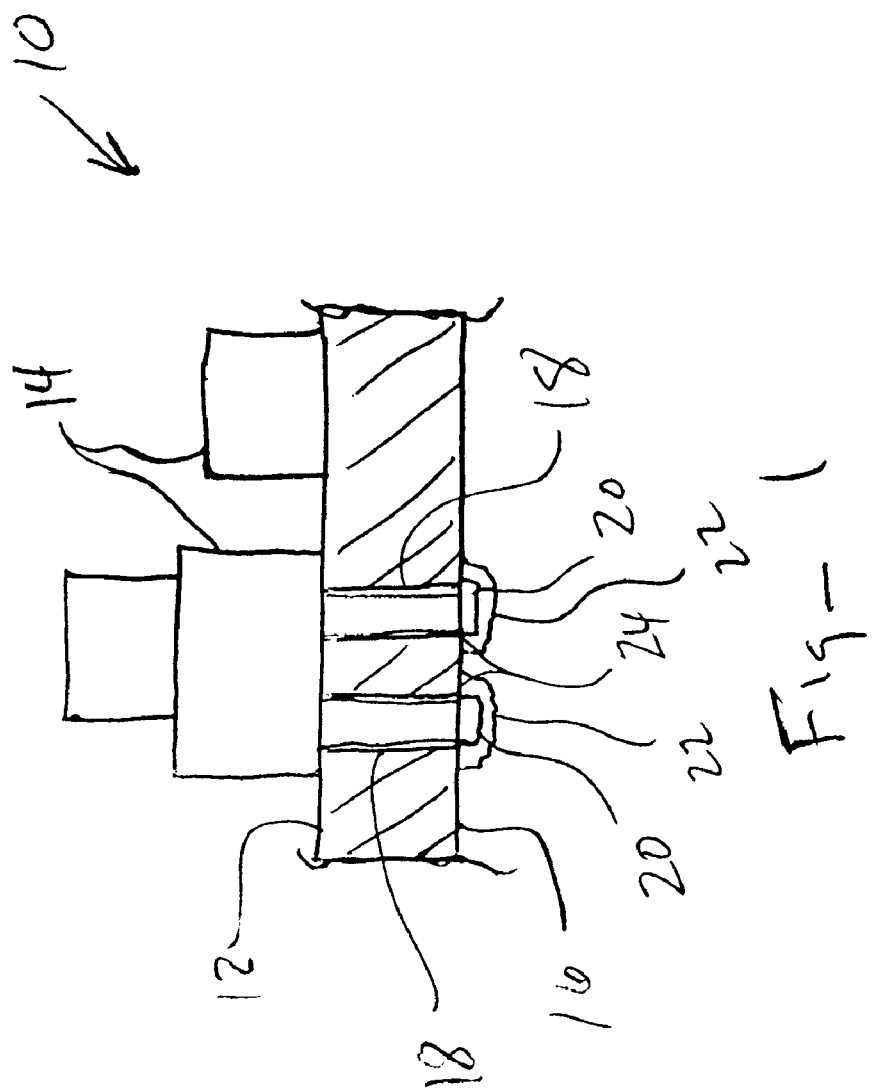

LED SURFACE MOUNT

BACKGROUND OF THE INVENTION

1. Field of the Invention

This invention relates to the mounting of electrical components on a printed circuit board.

2. Description of the Relevant Art

Light emitting diodes (LEDs) are well known. LEDs are commonly used in electrical circuits to indicate the status of a circuit, the change in status of a circuit, and/or to signal an alarm. In operation, LEDs are designed to "light up" when they pass current. Thus, LEDs are most commonly used on faceplates and other displays.

In many cases, the circuit or circuits of which the LED is a part, may be contained partially or wholly on a printed circuit board (PCB). Most PCBs typically include an electrically insulating substrate and a copper foil laid out or printed on one surface of the substrate according to a desired electronic circuit pattern. Resistors, capacitors, transistors, diodes and other electronic components are attached to the PCB according to the electronic circuit pattern.

In FIG. 1, a portion of a PCB 10 is shown, which has a component side 12, where components 14, such as ASICs, LEDS, memory chips, and generic processors, are mounted. The PCB 10 also has a solder side 16, where electrical connections to components 14 are made Typically, components are attached to PCBs by forming holes 18 through the substrate. At specific component attachment locations, leads or pins 20 from the components can be inserted through holes 18 from component side 12 of PCB 10, such that the component leads 20 project from solder side 16 of PCB 10. The projected portions of the component leads are soldered 22 to component-attaching lands 24 formed on solder side 16 of PCB 10.

When mounting components to the PCB it is desirable to keep the overall height profile of the PCB (with components) as thin as possible. This practice permits the greatest number of PCBs to be used together in the confines of a given card-based system, or to be used in miniaturized electronic devices. Typically, to insure a thin profile all components are mounted on a single side of the PCB. However, some components, such as the LED, take up valuable space on the component side of the PCB, which could be used for more valuable components. Accordingly, moving the LED to the solder side of the PCB, can significantly-improve the PCBs capacity. However, using the conventional component mounting method described above causes the LED to protrude out from the solder side of the PCB, significantly increasing the overall thickness of the PCB.

For these reasons, a need exists for a surface mountable LED, which may be mounted to the solder side of the PCB without significantly increasing the overall thickness profile of the PCB.

SUMMARY OF THE INVENTION

The present invention provides a surface mountable and low profile electrical component which can be electrically coupled to the solder side of a PCB, while other electrical components are mounted to a component side of the PCB. Advantageously, the electrical component is surface mounted to maintain a substantially low height profile.

As described in greater detail below, the surface mountable electrical component includes a mounting substrate having a diode or LED chip with electrical terminals. The LED chip is integrally mounted into a first side of the mounting substrate. Preferably, the LED chip extends out in a cantilevered arrangement from a first side of the mounting substrate. The terminals pass through the mounting substrate and extend out from an oppositely facing second side of the mounting substrate. The terminals can be electrically coupled to first and second electrical contacts, which provide an electrical pathway between the terminals and the PCB.

In operation, as the substrate is mounted to the PCB, the electrical contacts are made to intimately contact electrical conductors printed on the PCB, such that the electrical component becomes functional, which makes the LED chip operative.

There are many advantages to the present invention. For example, mounting space is created on the component side of the PCB for additional and potentially more valuable electrical components. As described in detail below, mounting the electrical component to the solder side of the PCB maintains a low thickness profile of the PCB.

Using the LED chip mounting technique of the present invention, a light source can be provided sufficiently thin, contributing to reduction in weight and size for portable apparatus or devices in which the electrical component is used.

Other uses, advantages, and variations of the present invention will be apparent to one of ordinary skill in the art upon reading this disclosure and accompanying drawings.

BRIEF DESCRIPTION OF THE DRAWINGS

FIG. 1 is a simplified cross-sectional illustration of a representative PCB with components attached;

DETAILED DESCRIPTION

Figure 2B:
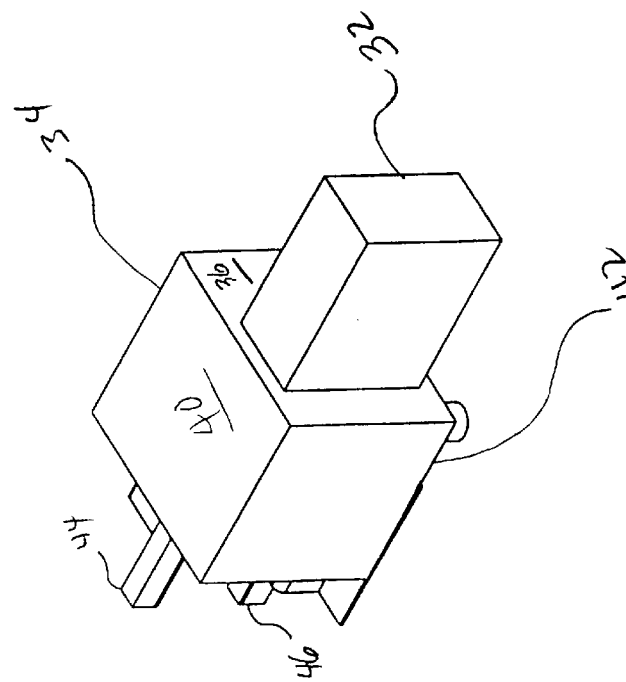
FIGS. 2A and 2B are illustrations of front and rear perspective views of an embodiment of the present invention.
Figure 2A:
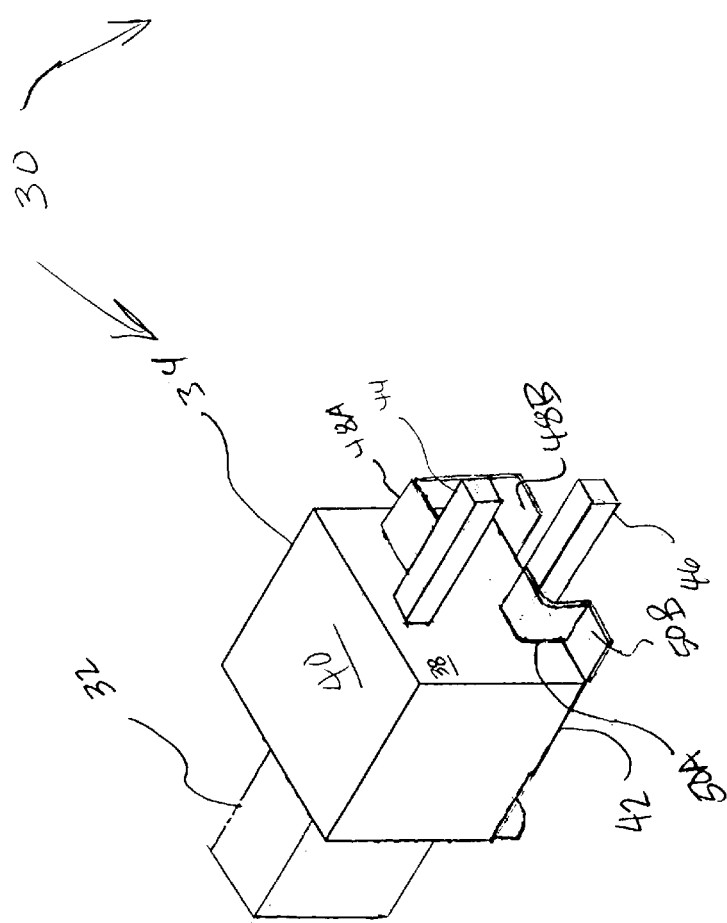

FIGS. 2A and 2B are illustrations of a front and rear perspective view of an embodiment of the present invention. As shown, electrical component 30 includes a diode chip 32 and a mounting substrate 34. In one embodiment, with no intent to limit the invention thereby, mounting substrate 34 is a cube shaped structure having a first side 36, a second side 38, a top side 40, and a bottom side 42. Diode chip 32 is mounted to first side 36, such that first terminal 44 and second terminal 46 extend out from an opposite side, side 38, of mounting substrate 34. On bottom side 42 are formed first and second electrical contacts 48 and 50 respectively.

As best understood with reference to FIG. 2A, portions 48B and 50B of electrical contacts 48 and 50 extend out from bottom side 42. Contact portions 48B and 50B are bent or curved upward along second side 38 to form contact portions 48A and 50A. In this manner, electrical contact portions 48A and 50A can be electrically coupled to first and second terminals 44 and 46.

Mounting substrate 34 may be formed of any suitable insulating material, such as any conventional resin. Mounting substrate 34 can be formed to any dimension or suitable geometric shape, as desired. In embodiment, with no intent to limit the invention, mounting substrate 34 is approximately a cube, which has a length of approximately 0.17 in., a width of approximately 0.19 in., and a height of approximately 0.17 in. These or similar dimensions provide compactness for electrical component 30.

Figure 3A:
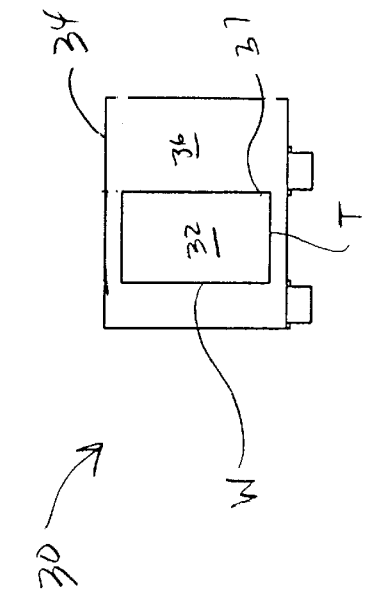
FIGS. 3A, 3B, and 3C are illustrations of a front, rear, and bottom view of the embodiment of FIGS. 2A and 2B.
Figure 3B:
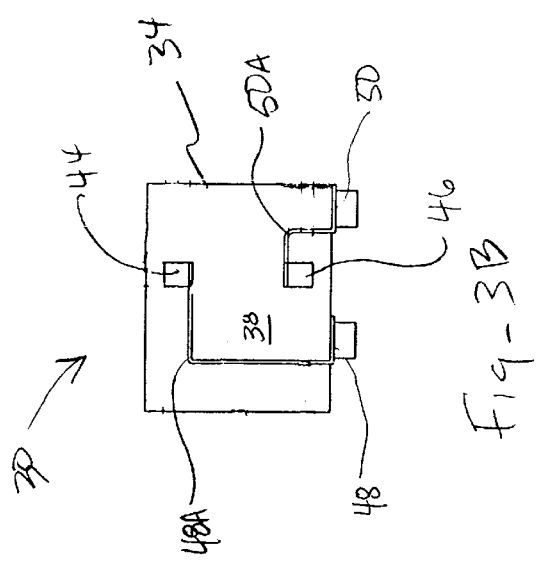
Figure 3C:
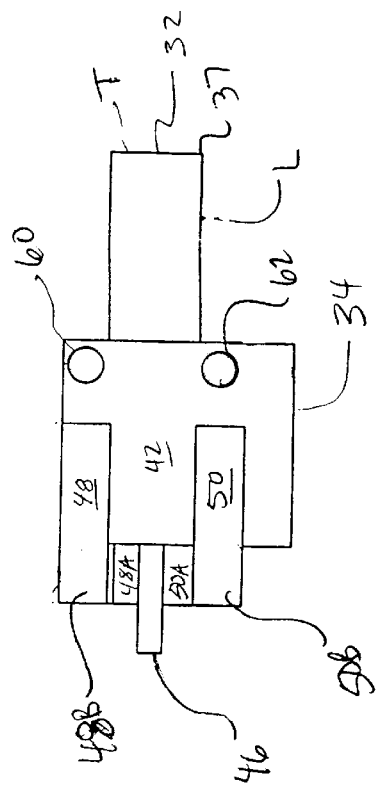

LED chip 32 is a conventional light emitting diode as is known in the art. A typical LED emits light based on a change in the energy levels when holes and electrons combine in the negative region of a positive-negative semiconductor diode. The shifts in energy cause photons to be generated, which are emitted as light energy. LED chip 32 can emit visible colors, such as blue, yellow, green, white, and red. LED chip 32, can be fabricated into any suitable geometric configuration with any desired dimensions as suited for a particular application. In one embodiment, LED chip 32 occupies a volume envelope as indicated by the rectangular form 37 shown in FIGS. 3A and 3C. In this embodiment, with no intent to limit the invention, shorter side W of LED chip 32 can be a length approximately 0.122 in., while the longer side L can be approximately 0.157 in. The thickness T of LED chip 32 can be approximately 0.075 in.

In one embodiment, LED chip 32 may be mounted in a reflector cup of a lead frame, wire bonded to terminals 44 and 46, and encased in a solid epoxy lens. LED chips for use in the present invention are commercially available from, for example, Dialight, Inc. of Manasquan, N.J.

As best understood with reference to FIGS. 3A–3C and FIG. 4, LED chip 32 is integrally mounted into mounting substrate 34, such that shorter side W of LED chip 32 extends in a direction perpendicular to a surface of PCB 64, while longer side L can extend in parallel to the surface of PCB 64.

Figure 4:
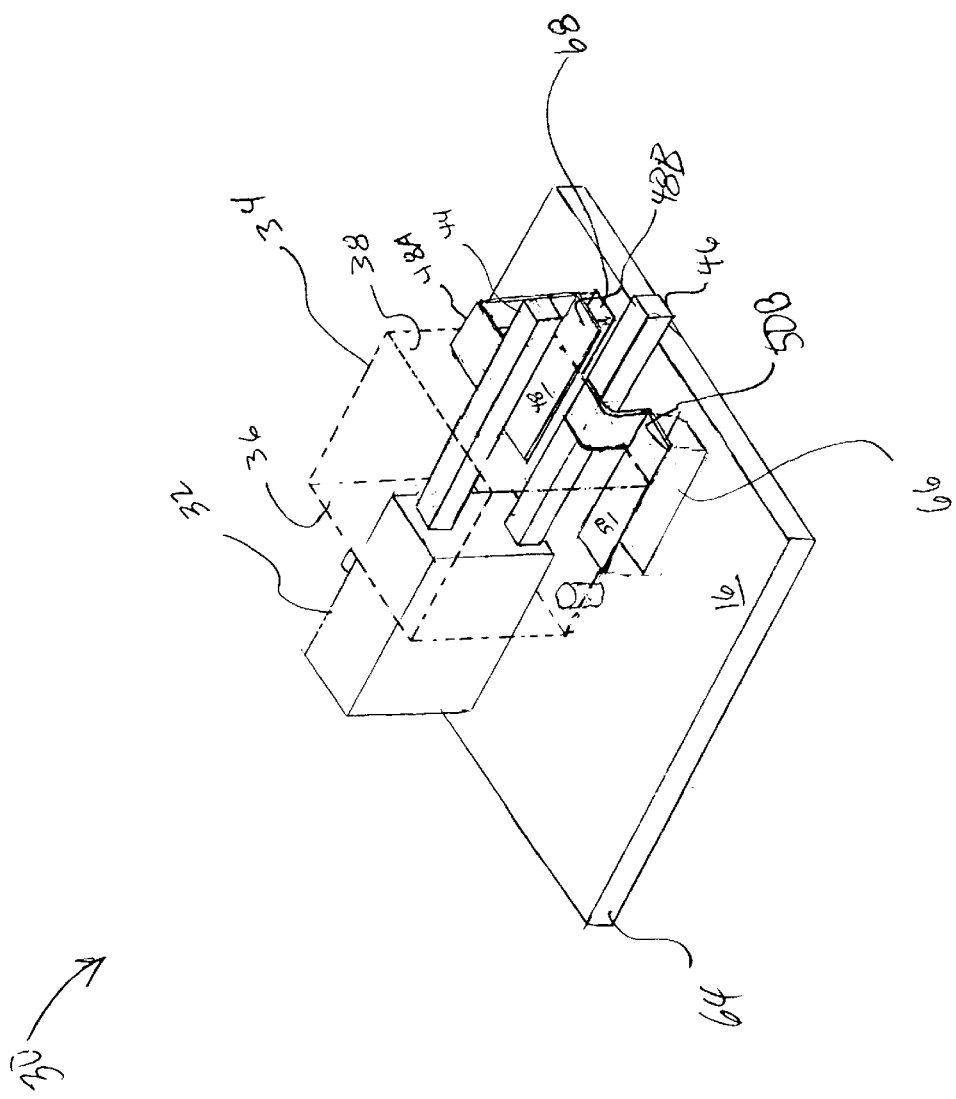
FIG. 4 is a simplified perspective view of an embodiment of the present invention.

As best understood with reference to FIG. 4, with mounting substrate 34 shown in phantom, LED chip 32 can be mounted at a position on first side 36, such that terminals 44 and 46 are fixed through mounting substrate 34 and protrude directly out from second side 38. Again referring to FIGS. 3A–3C, an electrical connection can be made between terminals 44 and 46 of LED chip 32 and portions 48A and 50A of electrical contacts 48 and 50. Connection can be made using conventional techniques, such as through a conductive adhesive including wire-bonding, solder, silver paste, and the like.

The electrical connection between terminals 44 and 46 and contact portions 48A and 50A, is provided on or proximate to second side 38, at a position below the height of mounting substrate 34. This eliminates the need for causing terminals 44 and 46 from extending through PCB 64 to be soldered on solder side 16(see FIG. 1.) Thus, the height of electrical component 30 may be reduced.

Referring, again to FIG. 4, electrical component 30 is mounted to PCB 64 such that contact 48 and 50 directly contact PCB electrical mounts 66 and 68. A solder paste or a silver paste may be applied to the surface of the electrical contacts 48 and 50 of the electrical component 30 and the surface of PCB electrical mounts 66 and 68 of PCB 64. The solder paste can then be melted by heating, or the silver paste, if used, is cured, so that contacts 48 and 50 are in electrical connection with associated PCB electrical mounts 66 and 68, thus fixing electrical component 30 to PCB 64. Standoffs 60 and 62 may be disposed on bottom side 42, to provide proper alignment of LED chip 32, prior to, during, and after solder reflow.

In the present invention, LED chip 32 is formed long in the L direction so that the resulting electrical component 30 is reduced in height without narrowing the light emitting area of LED chip 32. Consequently, the thinning of electrical component 30 is achieved without incurring a reduction in light emission nor any degradation in the performance of electrical component 30. Furthermore, since LED chip 32 is mounted at a position horizontally long on PCB 64 the terminals 44 and 46 can be directly coupled to contact portions 48A and 50A along second side 38 removing the necessity for causing terminals 44 and 46 from pushing through PCB 64, contributing to the thinning of the electrical component 30. To this end, it is possible to form electrical component 30 to a thickness no greater than 0.25 in; preferably no greater than 0.2 in.

The description of the invention given above is provided for purposes of illustration and is not intended to be limiting. The invention is set forth in the following claims.

What is claimed is:

1. A light emitting device comprising:

a mounting substrate having a first side, a second side, and a bottom side, said bottom side being a portion of said mounting substrate that contacts a printed circuit board when mounted;

a light emitting chip disposed on said first side having a first terminal and a second terminal each disposed on said second side, said light emitting chip having a long side which extends out perpendicular to said mounting substrate; and a first contact and a second contact, each having a first portion mounted on said bottom side of said mounting substrate, a second portion of said first contact being electrically coupleable to said first terminal and a second portion of said second contact being electrically coupleable to said second terminal.

2. The light emitting device of claim 1, wherein said light emitting chip is a rectangular shaped chip.

3. The light emitting device of claim 1, wherein said light emitting chip extends from said mounting substrate in a cantilevered arrangement.

4. The light emitting device of claim 1, wherein said light emitting chip and said terminals are integrally formed into a body of said mounting substrate with said light emitting chip extending out from a first side and said terminals extending out from an oppositely disposed second side.

5. The light emitting device of claim 1, wherein said first and said second contacts are electrically coupleable to a solder side of a printed circuit board.

6. The light emitting device of claim 1, wherein a height of said mounting substrate having light emitting chip mounted thereto is no greater than 2.0 in.

7. An electrical component for use with a printed circuit board (PCB), said electrical component comprising:

a mounting substrate having a first side, a second side, and a bottom side, said bottom side configured to contact said PCB;

an LED chip having first and second terminals, said LED chip and said terminals integrally formed into said mounting substrate with said LED chip extending from said first side and said terminals extending from said second side; and a first contact and a second contact, each having a first portion mounted on said bottom side of said mounting substrate, a second portion of said first contact being electrically coupleable to said first terminal and a second portion of said second contact being electrically coupleable to said second terminal.

8. The electrical component of claim 7, wherein a height of said electrical component is no greater than 0.2 in.

9. The electrical component of claim 7, wherein said LED chip has a long side which extends from said mounting substrate parallel to a surface of said PCB.

10. The electrical component of claim 7, wherein said first and said second contacts are configured to be electrically coupled to a solder side of said PCB.

* * * * *